(12) United States Patent
Buffet et al.

(10) Patent No.: US 6,483,720 B1
(45) Date of Patent: Nov. 19, 2002

(54) EMC PROTECTION IN DIGITAL COMPUTERS

(75) Inventors: Patrick H. Buffet, Essex Junction, VT (US); Paul Lee Clouser, Shelburne, VT (US); Danny Marvin Neal, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/640,512

(22) Filed: Aug. 17, 2000

(51) Int. Cl.[7] .................................................. H05K 9/00
(52) U.S. Cl. ........................ 361/818; 361/800; 361/816; 361/714; 174/35 R; 174/51
(58) Field of Search ................................ 361/818, 761, 361/764, 799, 816, 714, 730, 748, 753, 800, 752; 174/35 GC, 35, 35 TS, 51 R

(56) References Cited

U.S. PATENT DOCUMENTS 3,587,029 A * 6/1971 Knowles ...................... 339/14
5,506,373 A * 4/1996 Hoffman ................. 174/35 GC
6,166,435 A * 12/2000 Leu et al. .................... 257/704

\* cited by examiner

*Primary Examiner*—David Martin
*Assistant Examiner*—Hung Bui
(74) *Attorney, Agent, or Firm*—Robert V. Wilder; Mark E. McBurney

(57) ABSTRACT

A method and implementing electronic tri-plate connection system are provided including a nested set of RF Faraday cages within the system with integrated circuit packages containing the core drivers and receivers as the innermost Faraday cage, and additional Faraday cages being implemented at each outward level through card, board, backplane and unit level and into the network level. There is no distinction between power ground, signal ground or shield ground. All grounds throughout the system are at the same level and all package ground levels are interconnected.

10 Claims, 4 Drawing Sheets

EMC PROTECTION IN DIGITAL COMPUTERS

FIELD OF THE INVENTION

The present invention relates generally to information processing systems and more particularly to a methodology and implementation for electromagnetic radiation protection in digital electronic systems.

RELATED APPLICATIONS

Subject matter disclosed and not claimed herein is disclosed and claimed in one or more of the following related co-pending applications, which are assigned to the assignee of the present application and included herein by reference:
Attorney Docket AUS-2000-0248-US1;
Attorney Docket AUS-2000-0250-US1; and
Attorney Docket AUS-2000-0251-US1.

BACKGROUND OF THE INVENTION

As the operating frequencies of digital computers continues to increase over time, the higher frequencies present scalability problems for other system elements, such as the electromagnetic shields of the input-output (I/O) subsystem and electronic packaging. Such shielding is required in order to meet electromagnetic compatibility (EMC) requirements to avoid interference with other electronic equipment. It is common practice to use the external chassis as the major radio frequency (RF) EMC shield or "Faraday cage". Above 500 MHz, containment of the RF fields by such a Faraday cage at the box level becomes very difficult, since shielding at the box level becomes much more difficult at those frequencies. Further, current packaging technologies do not scale very well at all at the higher frequencies because of difficulties in providing adequate shielding at the box level for RF EMC noise isolation.

An RF Faraday cage is an electrically closed box of conducting surfaces. Where the conducting surfaces are sufficiently thicker than the electromagnetic skin depth at the RF frequency of interest so that internally generated RF fields are kept within the box. This is normally done by interconnecting the various parts of a unit's electrically conducting exterior surfaces in order to form the equivalent of a seamlessly closed box of conducting surfaces. By necessity, these surfaces are formed by many different smaller surfaces in order to meet normal reliability, availability and serviceability (RAS) requirements. This leaves many openings of slots and holes in the conducting surfaces. For mid frequencies, these openings can be kept much smaller than the wavelength of the RF to be contained so that the RF coupling through the openings is sufficiently small. Also, for mid frequencies, the interior dimensions of a typical box are sufficiently smaller than the wavelength of the RF so that no significant resonance enhancement of the RF coupling through the openings occurs. Above 500 MHz, containment of the RF fields by such a Faraday cage at the box level becomes very difficult. This is because the shorter wavelength itself enhances the coupling through standard size holes and because at the shorter wavelength, there is so much internal resonance, that one can always be found in any frequency band that will greatly enhance the coupling through some hole or slot.

Thus there is a need for an improved methodology and implementing system which provides for improved electromagnetic radiation protection in a digital signal processing system.

SUMMARY OF THE INVENTION

A method and implementing electronic connection system are provided including a nested set of RF Faraday cages within the system with integrated circuit packages containing the core drivers and receivers as the innermost Faraday cage, with additional Faraday cages being implemented at each outward level through card, board, backplane and unit level and into the network level.

BRIEF DESCRIPTION OF THE DRAWINGS

A better understanding of the present invention can be obtained when the following detailed description is considered in conjunction with the following drawings, in which.

DETAILED DESCRIPTION

The various methods discussed herein may be implemented within a computer system circuit board voltage distribution system as shown in the disclosed example although the teachings of the present invention are also applicable to voltage distribution systems in other electronic systems and sub-systems as well.

Figure 1:
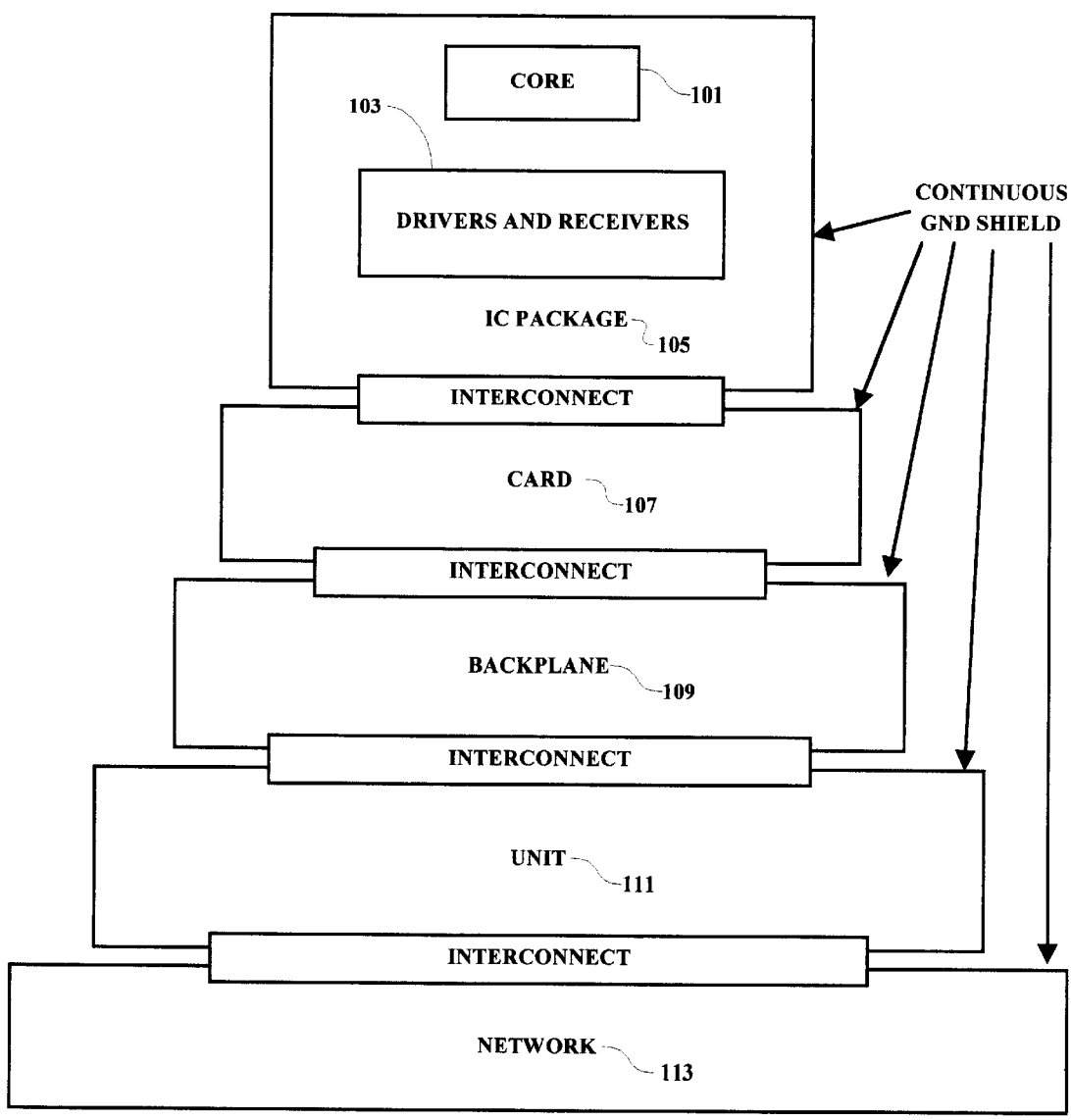
FIG. 1 is a schematic diagram of an exemplary nested ground shielding system within a digital computer system.

As illustrated in FIG. 1, the present invention addresses the system scalability problems at the level of the packaging technologies for digital computers, including system boards and backplanes, processor boards, system I/O boards, adapter cards and chip packages. In accordance with the present invention, a nested set of RF Faraday cages are implemented in an exemplary embodiment with the IC or chip package 105 containing the core 101, and the drivers and receivers 103 as the innermost unit and progressing outwardly through the card 107, backplane 109 and through the unit level 111 and into the network level 113 with continuous ground (GND) shields throughout the system, with all interconnects contained inside the continuous GND shield. By utilization of the hierarchical Faraday cage packaging technique described, packaging technology is designed and built for frequency scalability to keep pace with the continuing trend of ever increasing processor frequency.

Figure 2:
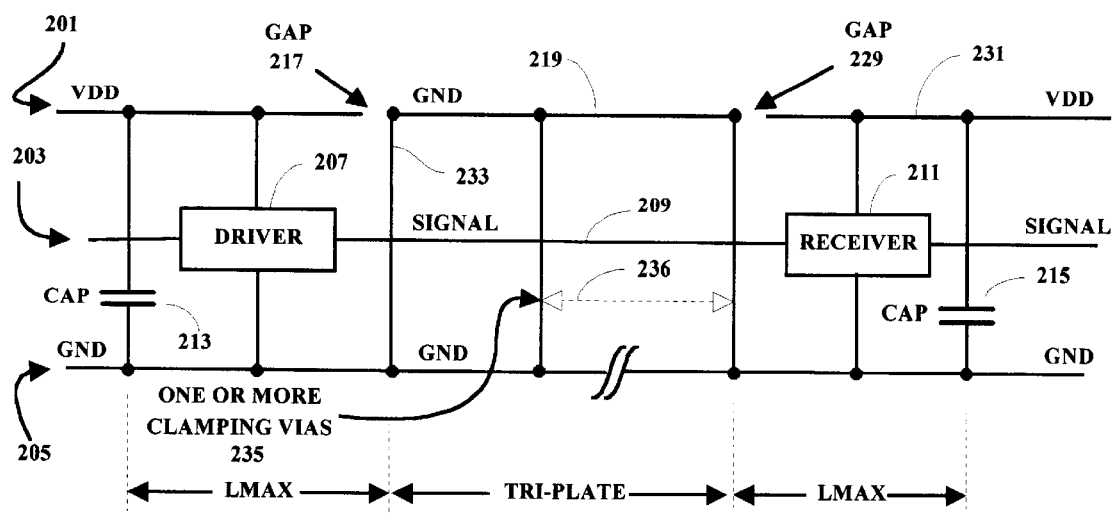
FIG. 2 is a schematic diagram of an exemplary circuit board illustrating the grounding techniques disclosed herein with regard to circuit board construction.

An exemplary embodiment of the present invention as implemented at the board level is illustrated in FIG. 2. As shown, there are three conducting planes arranged within a circuit board including a first plane 201, a second plane 203 and a third plane 205. The conducting planes in the exemplary embodiment are conducting surfaces disposed upon insulative material typically used in circuit board construction. The terms "plane" and "layer" are herein used interchangeably. The first plane or layer 201 includes adjacent defined areas of different potential, separated by gaps, e.g. 217 and 229 as shown, rather than having the entire top planar surface 201 held at a single potential as in prior art arrangements. The exemplary system further includes a driver 207, which is shown connected to a receiver 211 through signal line 209. The driver 207 is coupled to a VDD power plane area of the first plane 201 and is also coupled to a ground reference plane area on the third planar surface 205.

As further illustrated, a driver-related coupling capacitor 213 is connected between the VDD and GND planes at the location of the driver 207, and a receiver-related coupling capacitor 215 is connected between VDD and GND at the location of the receiver 211. In the illustrated embodiment, defined gaps such as gaps 217 and 229 are created in the upper plane surface 201 in order to define separate areas for VDD and GND potential connections on the same plane level of a circuit board (not shown). Although only three gaps are illustrated, it is understood that the gaps may be created along the entire plane to separate alternate areas, such as 219 and 231, of different potentials in order to provide areas of VDD and GND potential on the same board plane, for circuit connections. The illustrated construction also creates a tri-plate structure in which the signal line 209 is shielded or covered on the top and bottom sides of the signal line 209 by conducting layers 219 and 205 within a circuit board, and the shielding layers are held at the same potential. This construction provides significantly enhanced signal isolation for the signals being transmitted along the signal line 209.

In the illustrated example, the ground plane 205 is continuous and does not include the gap design as does the first plane 201, although such a gapped-construction in the third plane 205 could also be implemented in accordance with the present invention. As shown in the exemplary embodiment, the ground plane 205 is directly connected to all of the ground areas GND of the first plane 201, such as 219, through vias, such as vias 233. Further, additional clamping vias 235 are provided along the transmission line section 236 between the driver 207 and the receiver 211 as needed to insure potential integrity and signal isolation.

As illustrated, the present invention defines the use of driver-specific and receiver-specific de-coupling capacitors at the driver 207 and at the receiver 211, respectively. There are also provided defined gaps, e.g. 217 and 229, separating VDD power plane areas e.g. 231, from GND plane areas e.g. 219.

In the illustrated exemplary embodiment, the various parameters and relationships implemented are defined as follows:

LMAX<LAMBDA/20.
LAMBDA=(v/Baudrate)/n.
v=velocity of light in a vacuum.
Baudrate=Data rate as physically measured between SIGNAL and GND.
n=the square root of the dielectric constant of the propagating medium.

The action of the sub-circuit formed by the capacitors 213 and 215, the gaps, e.g. 217, and the vias, within each LMAX section, blocks the switching energy and/or the VDD noise from entering the tri-plate GND-SIG-GND reference system. The capacitors are very low inductance de-coupling capacitor which provides the required AC short-circuit in the VDD-GND area. The combinations of the gaps and the vias isolate VDD to the region bounded by LMAX. This isolation enables the use of true tri-plate construction as shown. Containing these elements within LMAX distance of each other is required to keep the elements in the same reference plane in a microwave sense through the fifth harmonic.

For example, if v=30 cm/ns, n=1.7 for PTFE material, and Baudrate=1 Gbit/s, then LAMBDA=18 cm and LMAX=0.9 cm. For Baudrate=2 Gbit/s, LMAX=0.45 cm. Since most chip/package combinations have on-package signal wires longer that 2 cm, this means that at 450 MHz and above, this invention separates power and high speed systems at the chip and package level. For card, board, backplane and unit level, the power system and the logic system remain separate. Power may thus be advantageously treated as truly a low speed KHz rate system without logic-injected high frequency components. Logic signal transmission may thus use advantageously clean and simple tri-plate without the need for DC-isolated reference planes.

Thus, each driver and each receiver is surrounded with its own capacitor, gap and via as shown, to form a module. The included components in each module block the switching energy and/or VDD noise from entering the tri-plate GND-GND reference system as hereinbefore noted. The capacitors have a very low series inductance and supply the charge needed for the driver or receiver to properly function. In the example, the capacitors are of the type normally found on chips and packages and provide inductance levels that are much lower than can be attained on a card or a board. The gaps block the tri-plate transmission system from residual noise that the capacitors still allow to exist on VDD. The vias (may be many vias in parallel along the open-circuit gaps as long as all are within the region LMAX) reduces the noise that gets past the gaps by providing a complementary short-circuit.

In accordance with the present invention, a driver or receiver module includes the driver or receiver together with a corresponding module capacitor (CAP), gap (GAP) and via (VIA), all within a distance defined as LMAX of each other. In the example, LMAX is 1/10 of the quarter wavelength of the fundamental frequency derived by a continuously alternating (i.e. ". . . 1010101 . . .") logic signal string. This assures that frequencies up to and including the fifth harmonic of that string, that the GAP, CAP and VIA are all in the same reference plane in the microwave sense. This means that all of the module components are sufficiently close that they all see each other as the opens, shorts and capacitors that they really are without the impedance transformation that a quarter-wave or more of mutual separation would produce.

As hereinbefore noted, the illustrated exemplary construction addresses the problem of scalability to higher operating frequencies for packaging technologies for digital computers, including system boards and backplanes, processor boards, system I/O boards and adapter cards. In accordance with the disclosed construction, multiple logic signal (SIG) transmission lines are positioned between a pair of like-potential reference planes, e.g. 205 and 219, to form a tri-plate structure for transmitting logic signals from a driver to one or more receivers. With the construction shown, de-coupling capacitors along the length of the transmission line section are not required since both planes are at the same potential. Further, direct short-circuit connections are implemented with vias to insure reference voltage integrity along the length of the signal line within the tri-plate area. The high series inductance of the three part combination of via-component-via of de-coupling capacitors is replaced with the much lower inductance of one or more short-circuit connections through clamping vias. Each of the clamping vias is effective to much higher frequencies at clamping the voltage references together in the tri-plate section than the via-de-coupling component-via series combination because the de-coupling component for cards and boards is not appreciably less than 1 nano-henry, but the vias can be made arbitrarily large and short so that their inductance can be much smaller than one nano-henry.

Figure 3:
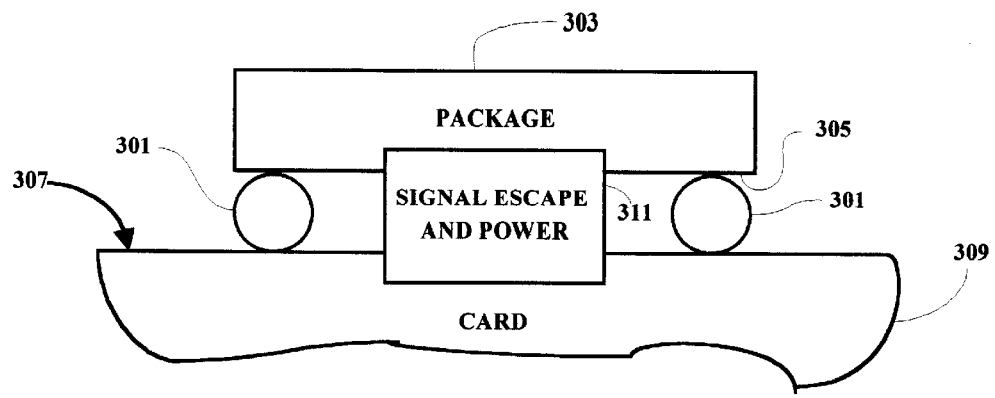
FIG. 3 is a schematic diagram of an exemplary IC chip-to-circuit board interface illustrating the grounding techniques disclosed herein.

In accordance with the present invention, at the IC package level, the core 101 drivers and receivers 103 are electrically sealed within a Faraday cage shield consisting of a package grounding lid, a package wrap-around ground on all four edges and a package bottom ground plate. As shown in FIG. 3, at the next level of packaging hierarchy, ground continuity to the card is provided by a ring of ball grid array (BGA) ground solder balls 301 around the perimeter of the package 303 in order to connect the bottom ground surface layer 305 of the package 303 to the adjacent surface level 307 of the card 309. In this manner, the signal escape and power interconnect 311 between the card 309 and the IC package 303 is shielded, and the Faraday cage shield is carried through from the package to the card levels. Thus, the first level of the Faraday cage system is established. The small dimensions of the IC package and the package-to-card interface assures that the holes and slots at this level are sufficiently small and that there is no resonance for any frequency band being used.

Figure 4:
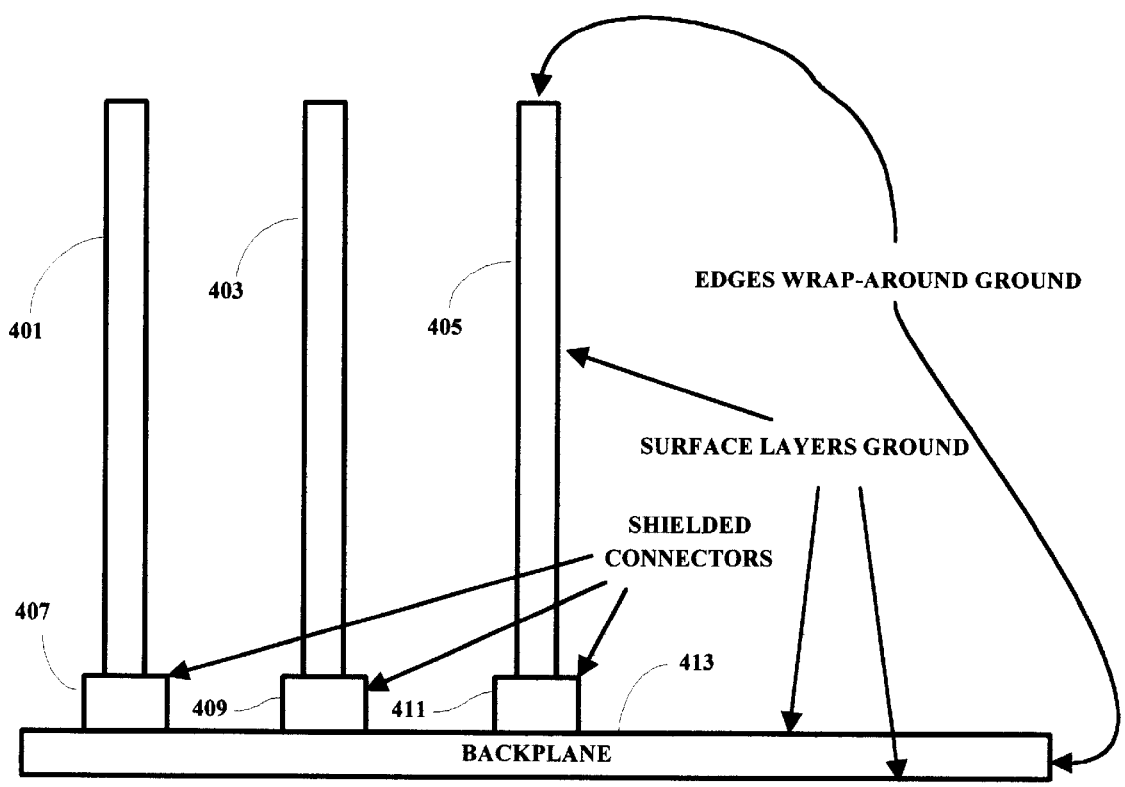
FIG. 4 is a schematic diagram of an exemplary card-to-backplane interface illustrating the grounding techniques disclosed herein.

The next level in the Faraday cage shielding system includes the card-to-backplane interface as illustrated in FIG. 4. A series of circuit cards or boards 401, 403 and 405 are inserted into connectors 407, 409 and 411 for connection into a backplane 413. As shown, a Faraday cage is formed by wrap-around grounds at all card and backplane edges. All surface edges are also at the same ground level as well as are shielded connectors 407, 409, 411, which connect the cards 401, 403, 405 to the backplane 413 at the card-to-back-plane interface.

Figure 5:
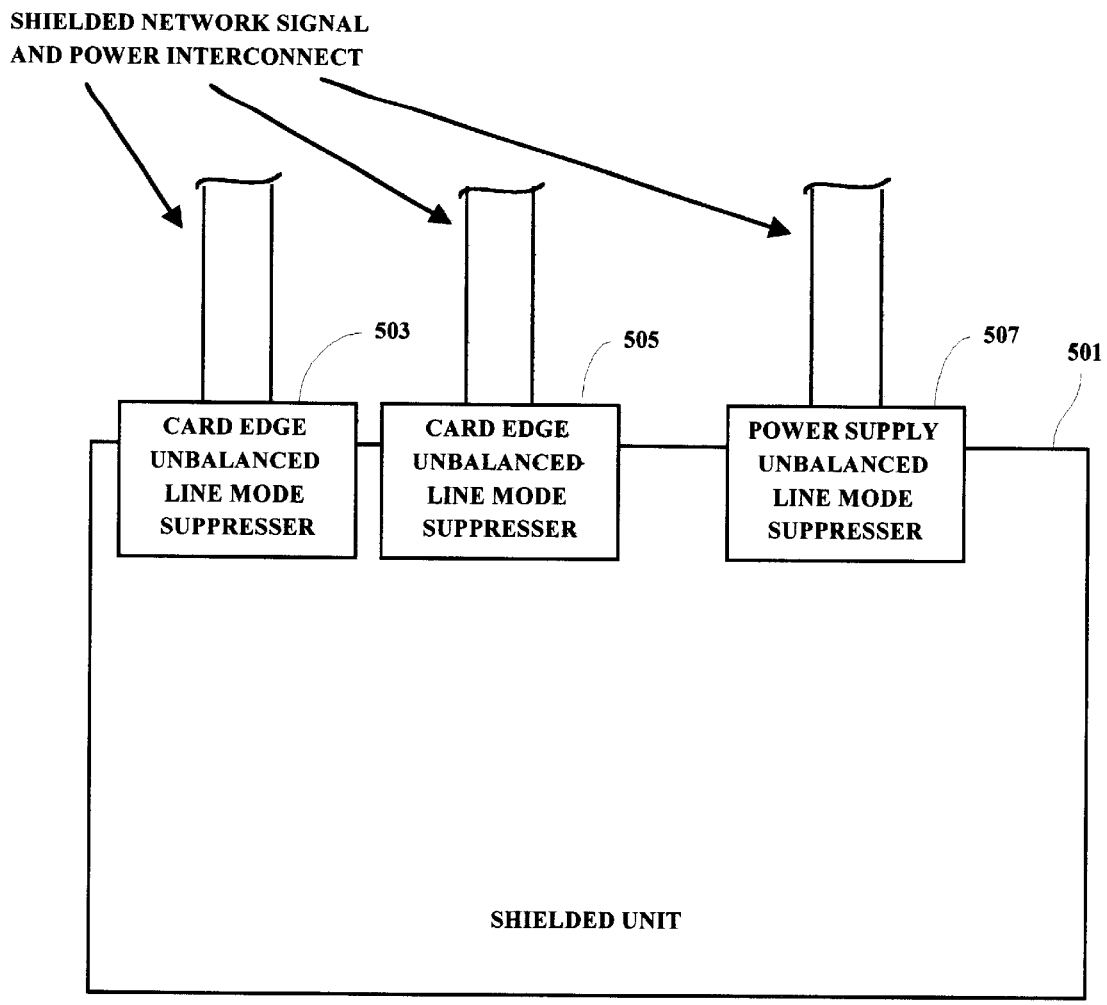
FIG. 5 is a schematic diagram of an exemplary network-to-terminal interface illustrating the grounding techniques disclosed herein.

Given that the package, card and backplane are hierarchically interconnected as shown, and that other system components, such as power supplies, have been similarly interconnected, then, as shown in FIG. 5, at the unit or terminal level, all of the sub-assemblies are installed within the unit shield 501 and connected to the shielded network signal interconnect, shielded power interconnect, and any other shielded external system interconnect, usually through unbalanced line mode suppressors, e.g. 503, 505, 507, which prevent the external lines from acting as antennas.

With the present invention, throughout the system, there is no distinction between power ground, signal ground or shield ground. All grounds throughout the system are at the same level and all package levels are interconnected. This is possible because of the fundamental tri-plate structure, i.e. GND-SIG-GND, of the transmission system. In prior art electronic systems and computer systems, VDD, GND and signal are so intertwined that much slot and dipole antenna radiation is generated. With the present invention, only ground surfaces are exposed and thus no antenna structures are present and no radiation is produced. Because VDD is kept away from the signal, VDD is transmitted around the unit contained in its own tri-plate structure as are the signals being transmitted within the system. With the present invention, the highest frequency components of leakage radiation tend to be suppressed inside the smallest components where they are generated. This means that each level in the hierarchy tends not to pass high frequency ground currents up to the next level, which level would be scaled physically larger and thus less capable of containing such ground currents.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A signal processing system comprising:

an integrated circuit (IC) package, said IC package including IC signal conductors extending from an integrated circuit mounted on said IC package to edge terminals located on at least one edge of said IC package, said IC signal conductors being shielded by IC shielding means within said IC package, said IC shielding means comprising first and second conductive surfaces positioned above and below said IC signal conductors, respectively, on said IC package, said IC shielding means being arranged for connection to a system ground potential;

a circuit board, said circuit board being arranged to have said IC package mounted thereon; and board connector means arranged for enabling an electrical connection between said IC package and said circuit board, said board connector means including a board connector shielding means surrounding said board connector means, said board connector shielding means being selectively electrically connected to said IC shielding means.

2. The signal processing system as set forth in claim 3 and further including:

a unit enclosure arranged to enclose said backplane and circuit boards connected to said backplane, said unit enclosure including enclosure terminal means connected to said backplane interface, said backplane interface including backplane conductors connected between said board terminals and said enclosure terminal means; and backplane shielding means for shielding said backplane conductors, said backplane shielding means being arranged to be selectively connected to said backplane interface shielding means.

3. The signal processing system as set forth in claim 2 wherein said backplane shielding means is electrically connected to said unit enclosure whereby said unit enclosure comprises a plurality of nested and interconnected individually shielded signal-conducting sub-systems.

4. The signal processing system as set forth in claim 3 and further including a cable device arranged for connecting said enclosure terminal means to a network of electronic devices, said cable including a cable shielding means arranged to be selectively connected to said unit enclosure.

5. The signal processing system as set forth in claim 4 wherein said signal processing system includes a plurality of said network devices connected together, each of said network devices including a plurality of interconnected individually shielded signal conductor sub-systems with shielding means for each of the sub-systems being connected together.

6. A method for assembling a signal processing system, said method comprising:

providing an integrated circuit (IC) package, said IC package including IC signal conductors extending from an integrated circuit mounted on said IC package to edge terminals located on at least one edge of said IC package, said IC signal conductors being shielded by IC shielding means within said IC package, said IC shielding means comprising first and second conductive surfaces positioned above and below said IC signal conductors, respectively, on said IC package, said IC shielding means being arranged for connection to a system ground potential;

mounting said IC package on a circuit board; and providing board connector means arranged for enabling an electrical connection between said IC package and said circuit board, said board connector means including a board connector shielding means surrounding said board connector means, said board connector shielding means being selectively electrically connected to said IC shielding means.

7. The method as set forth in claim 6 and further including:

providing a unit enclosure arranged to enclose said backplane and circuit boards connected to said backplane, said unit enclosure including enclosure terminal means connected to said backplane interface, said backplane interface including backplane conductors connected between said board terminals and said enclosure terminal means; and installing a backplane shielding means for shielding said backplane conductors, said backplane shielding means being arranged to be selectively connected to said backplane interface shielding means.

8. The method as set forth in claim 7 wherein said backplane shielding means is electrically connected to said unit enclosure whereby said unit enclosure comprises a plurality of nested and interconnected individually shielded signal-conducting sub-systems.

9. The method as set forth in claim 8 and further including providing a cable device arranged for connecting said enclosure terminal means to a network of electronic devices, said cable device including a cable shielding means arranged to be selectively connected to said unit enclosure.

10. The method as set forth in claim 9 and further including connecting a plurality of said network devices together, each of said network devices including a plurality of interconnected individually shielded signal conductor sub-systems with shielding means for each of the sub-systems being connected together.

* * * * *

UNITED STATES PATENT AND TRADEMARK OFFICE
CERTIFICATE OF CORRECTION

PATENT NO.   : 6,483,720 B1                                                                 Page 1 of 1
DATED        : November 19, 2002
INVENTOR(S)  : Buffet et al.

It is certified that error appears in the above-identified patent and that said Letters Patent is hereby corrected as shown below:

Column 6,
Line 31, please delete "3" and insert -- 1 --.

Signed and Sealed this

Second Day of September, 2003

JAMES E. ROGAN
*Director of the United States Patent and Trademark Office*